(12) United States Patent
Xie

(10) Patent No.: US 10,332,963 B1
(45) Date of Patent: Jun. 25, 2019

(54) UNIFORMITY TUNING OF VARIABLE-HEIGHT FEATURES FORMED IN TRENCHES

(71) Applicant: GLOBALFOUNDRIES Inc., Grand Cayman (KY)

(72) Inventor: Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 11 days.

(21) Appl. No.: 15/882,031

(22) Filed: Jan. 29, 2018

(51) Int. Cl.
*H01L 29/66* (2006.01)
*H01L 29/06* (2006.01)
(Continued)

(52) U.S. Cl.
CPC .... *H01L 29/0673* (2013.01); *H01L 21/02532* (2013.01); *H01L 21/02636* (2013.01); *H01L 21/3065* (2013.01); *H01L 21/31116* (2013.01); *H01L 29/0847* (2013.01); *H01L 29/1033* (2013.01); *H01L 29/6653* (2013.01); *H01L 29/6656* (2013.01); *H01L 29/66545* (2013.01); *H01L 29/66553* (2013.01); *H01L 29/66636* (2013.01); *H01L 29/66795* (2013.01); *H01L 29/785* (2013.01); *H01L 21/0217* (2013.01); *H01L 21/0228* (2013.01); *H01L 21/02186* (2013.01); *H01L 21/3081* (2013.01); *H01L 21/31053* (2013.01); *H01L 29/0649* (2013.01); *H01L 29/45* (2013.01); *H01L 29/4966* (2013.01); *H01L 29/517* (2013.01); *H01L 29/665* (2013.01)

(58) Field of Classification Search
CPC ........... H01L 29/0673; H01L 21/02532; H01L 29/6653; H01L 29/6656; H01L 21/31116; H01L 21/02636; H01L 29/0847; H01L 29/1033; H01L 29/66545; H01L 29/66795; H01L 29/66553; H01L 21/3065; H01L 29/66636; H01L 29/785; H01L 29/0649; H01L 21/3081; H01L 21/0217; H01L 21/0228
See application file for complete search history.

(56) References Cited

U.S. PATENT DOCUMENTS 9,324,812 B2 *  4/2016  Yang .................... H01L 29/0676
9,362,355 B1 *  6/2016  Cheng ............... H01L 29/66742
(Continued)

OTHER PUBLICATIONS

Bentley et al., "Method and Structure to Control Channel Length in Vertical FET Device", U.S. Appl. No. 15/351,747, filed Nov. 15, 2016.

*Primary Examiner* — David Vu
(74) *Attorney, Agent, or Firm* — Thompson Hine LLP; Anthony Canale

(57) ABSTRACT

Methods of forming a structure for a field-effect transistor and related structures. A trench is formed in one or more semiconductor layers, and forming first and second sacrificial sidewall spacers are formed on an upper portion of the trench. A material is formed in the trench that is arranged in part between the first sacrificial sidewall spacer and the second sacrificial space. After forming the material in the trench, the first and second sacrificial sidewall spacers are removed. After removing the first and second sacrificial sidewall spacers, an upper portion of the material is removed with an isotropic etching process.

19 Claims, 8 Drawing Sheets

(51) Int. Cl.
*H01L 21/311* (2006.01)
*H01L 21/02* (2006.01)
*H01L 29/08* (2006.01)
*H01L 29/10* (2006.01)
*H01L 29/78* (2006.01)
*H01L 21/3065* (2006.01)
H01L 29/45 (2006.01)
H01L 21/308 (2006.01)
H01L 21/3105 (2006.01)
H01L 29/51 (2006.01)
H01L 29/49 (2006.01)

(56) References Cited

U.S. PATENT DOCUMENTS

2012/0195122 A1   8/2012   Ohmaru
2016/0268434 A1   9/2016   Ching et al.

\* cited by examiner

US 10,332,963 B1

UNIFORMITY TUNING OF VARIABLE-HEIGHT FEATURES FORMED IN TRENCHES

BACKGROUND

The present invention relates to semiconductor device fabrication and integrated circuits and, more specifically, to methods of forming a structure for a field-effect transistor and related structures.

Device structures for a field-effect transistor generally include a source, a drain, and a gate electrode configured to switch carrier flow in a channel formed in a semiconductor body between the source and drain. The body and channel of a planar field-effect transistor are arranged beneath the top surface of a substrate on which the gate electrode is supported. When a control voltage exceeding a designated threshold voltage is applied to the gate electrode, the flow of carriers in the channel produces a device output current.

A fin-type field-effect transistor (FinFET) is a non-planar device structure for a field-effect transistor that may be more densely packed in an integrated circuit than planar field-effect transistors. A FinFET includes a fin, heavily-doped source/drain regions, and a gate electrode that wraps around the fin. During operation, a channel for carrier flow is formed in the fin between the source/drain regions. In comparison with planar field-effect transistors, the arrangement between the gate structure and fin improves control over the channel and reduces the leakage current when the FinFET is in its 'Off' state. This, in turn, lowers threshold voltages in comparison with planar field-effect transistors, and results in improved performance and lowered power consumption.

Nanosheet field-effect transistors have been developed that may permit additional increases in packing density in an integrated circuit. The body of a nanosheet field-effect transistor includes multiple nanosheet channel layers vertically stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched and removed in order to release the nanosheet channel layers, and to provide spaces for the formation of the gate stack.

SUMMARY

In embodiments of the invention, a method includes forming a trench in one or more semiconductor layers, forming a first sacrificial sidewall spacer and a second sacrificial sidewall spacer on an upper portion of the trench, and forming a material in the trench that is arranged in part between the first sacrificial sidewall spacer and the second sacrificial space. After forming the material in the trench, the first sacrificial sidewall spacer and the second sacrificial sidewall spacer are removed. After removing the first sacrificial sidewall spacer and the second sacrificial sidewall spacer, an upper portion of the material is removed with an isotropic etching process.

In embodiments of the invention, a structure includes a nanosheet field-effect transistor with a plurality of nanosheet channel layers arranged in a layer stack and a source/drain region having a non-planar top surface with a curved central section. The structure further includes a contact extending vertically to the non-planar top surface of the source/drain region.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIG. 1B is a top view of the device structure in which FIG. 1 is taken generally along line 1-1 and FIG. 1A is taken generally along line 1A-1A.

DETAILED DESCRIPTION

Figure 1:
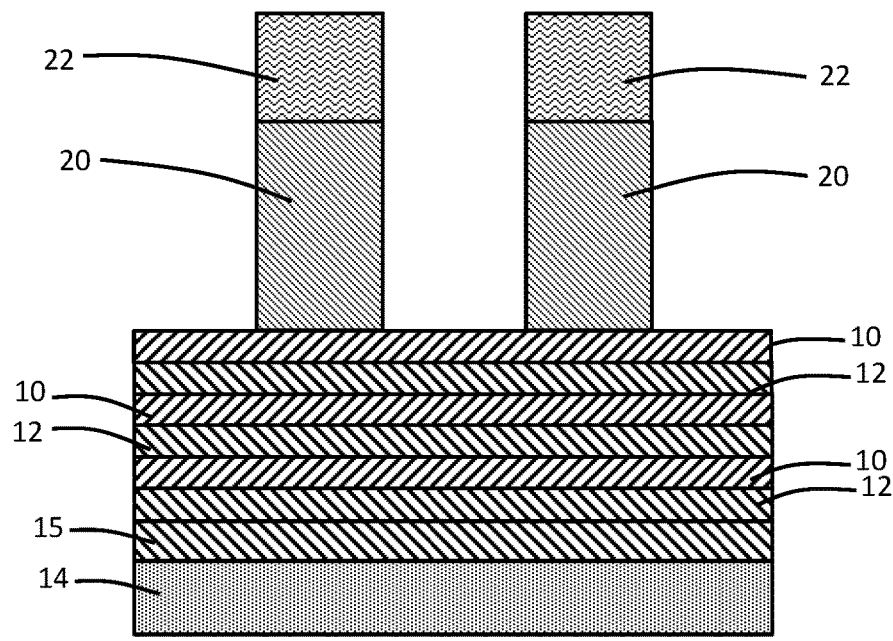
FIGS. 1 and 1A are cross-sectional views of a device structure at an initial fabrication stage of the processing method in accordance with embodiments of the invention.
Figure 1A:
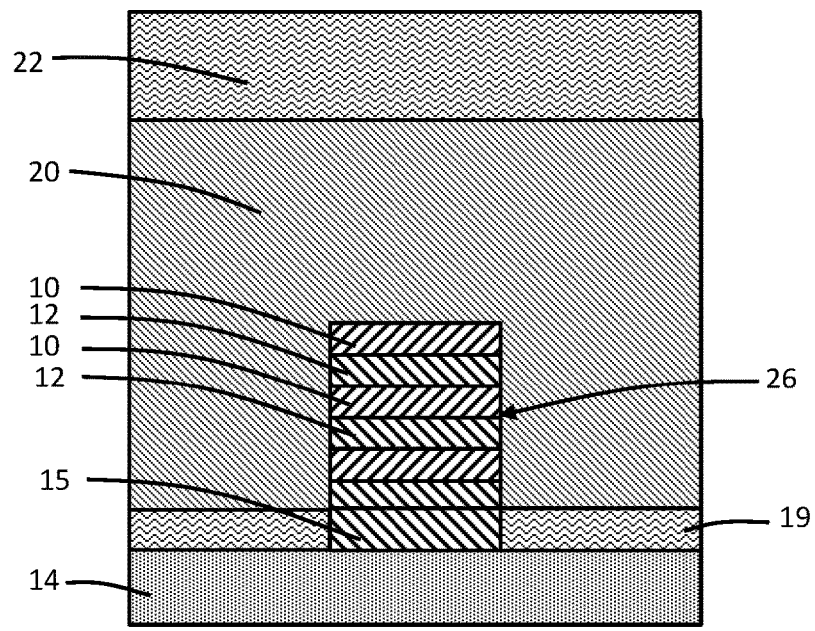
Figure 1B:
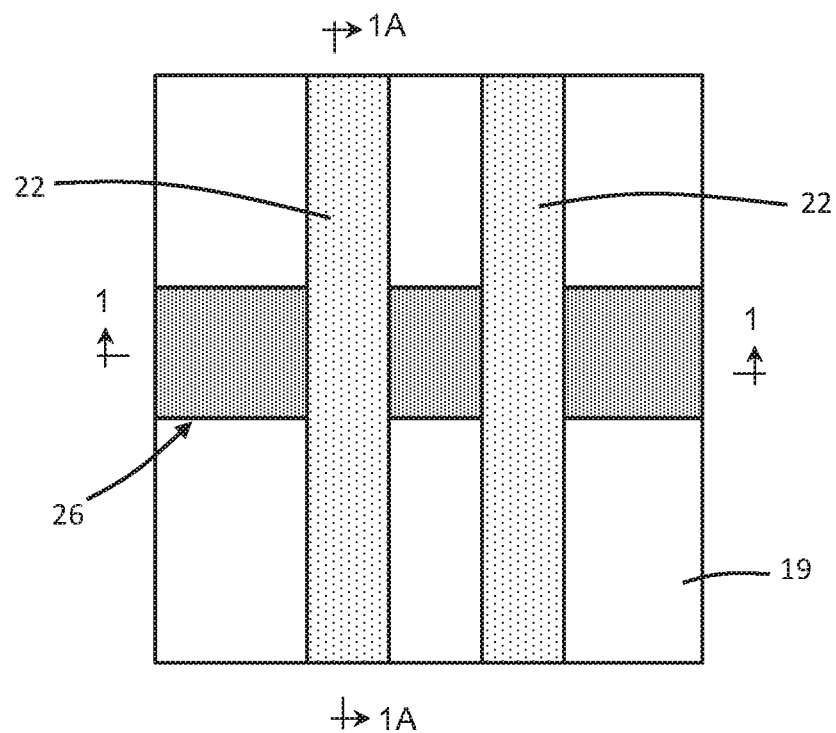

With reference to FIGS. 1, 1A, 1B and in accordance with embodiments of the invention, a fin or body feature 26 includes nanosheet channel layers 10, sacrificial layers 12, and a sacrificial layer 15 that are arranged in a patterned layer stack on a substrate 14. The substrate 14 is composed of a semiconductor material, such as single crystal silicon. The nanosheet channel layers 10, sacrificial layers 12, and sacrificial layer 15 may be formed by an epitaxial growth process during which the composition is alternated through variation of the reactants. The number of nanosheet channel layers 10 and sacrificial layers 12 may differ from the number in the depicted representative embodiment and, in particular, may be greater than the number in the representative embodiment and may be added in additional pairs of nanosheet channel layers 10 and sacrificial layers 12. Shallow trench isolation regions 19 composed of an oxide of silicon (e.g., silicon dioxide) are arranged in the substrate 14 about the body feature 26 and may be formed by a shallow trench isolation (STI) technique.

The nanosheet channel layers 10 are composed of a semiconductor material, and the sacrificial layers 12 are composed of a semiconductor material that is selected to be removed selective to the semiconductor material of the nanosheet channel layers 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the nanosheet channel layers 10 may be composed of silicon (Si), and the sacrificial layers 12 may be composed of silicon germanium (SiGe) with a germanium content of twenty percent (20%) to thirty-five percent (35%) that etches at a higher rate than silicon.

The sacrificial layer 15 is composed of a semiconductor material that is selected to be removed selective to the semiconductor material of the nanosheet channel layers 10 and selective to the semiconductor material of the sacrificial layers 12. In an embodiment, the sacrificial layer 15 may be composed of silicon germanium (SiGe) with a germanium content that is greater than the germanium content of the sacrificial layers 12, which provides the etch selectivity. For example, the germanium content of the sacrificial layer 15 may be sixty percent (60%) if the germanium content of the sacrificial layers 12 is thirty-five percent (35%).

Sacrificial gate structures 20 are formed with a given pitch that wrap around the body feature 26 and extend over the shallow trench isolation regions 19. The sacrificial gate structures 20 may include a thin oxide layer adjacent to the body feature 26 and a layer of sacrificial material, such as amorphous silicon, that are patterned with reactive ion etching (ME) using a hardmask. The sacrificial gate structures 20 are arranged between adjacent sacrificial gate structures (not shown) arranged along the length of the body feature 26. The sacrificial gate structures 20 may be cut along their lengths to define the locations of individual field-effect transistors. Each of the sacrificial gate structures 20 is covered by a hardmask cap 22 arranged on its top surface. The hardmask caps 22 may be composed of, for example, silicon nitride ($Si_3N_4$), and may be a remnant of the hardmask from the process forming the sacrificial gate structures 20.

Figure 2:
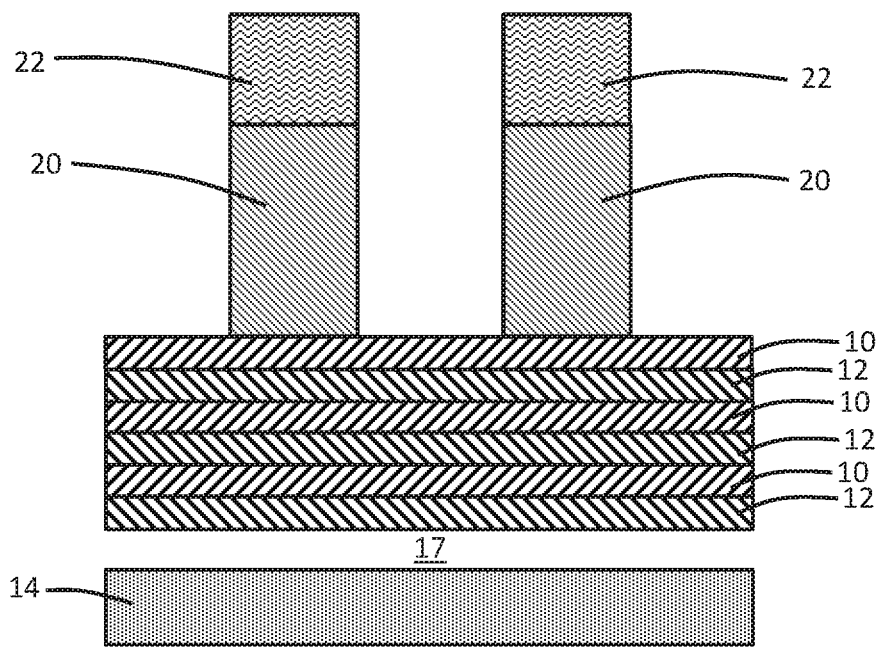
FIGS. 2 and 2A are a cross-sectional views of the device structure at a fabrication stage of the processing method subsequent to FIGS. 1 and 1A.
Figure 2A:
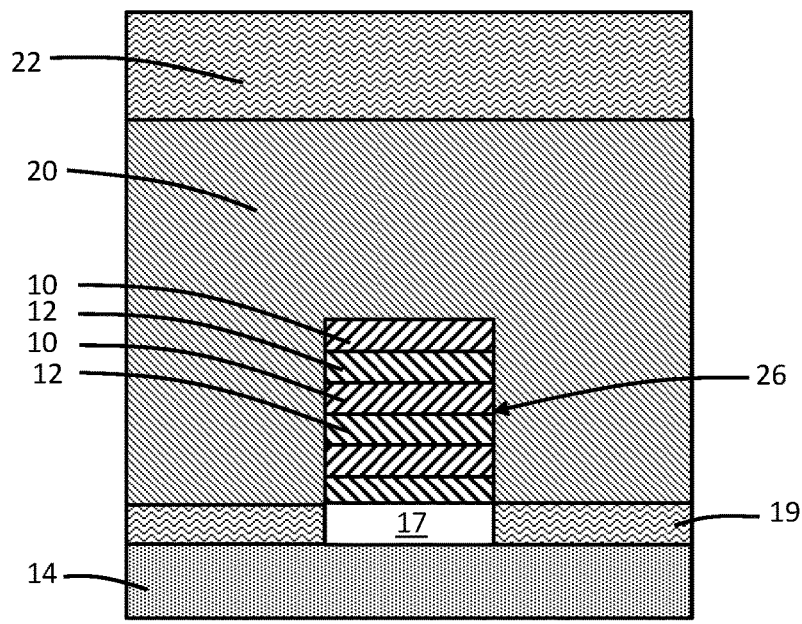

With reference to FIGS. 2, 2A in which like reference numerals refer to like features in FIGS. 1, 1A and at a subsequent fabrication stage of the processing method, the sacrificial layer 15 is selectively removed relative to the nanosheet channel layers 10 and relative to the sacrificial layers 12 with an etching process. The removal of the sacrificial layer 15 opens a cavity 17 that is arranged beneath the body feature 26.

Figure 3:
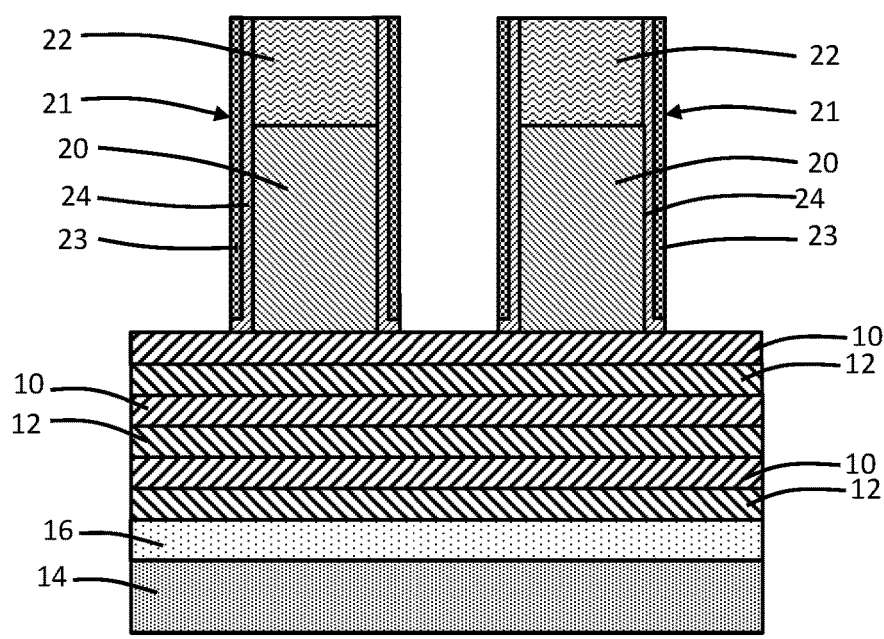
FIGS. 3 and 3A are cross-sectional views of the device structure at a fabrication stage of the processing method subsequent to FIGS. 2 and 2A.
Figure 3A:
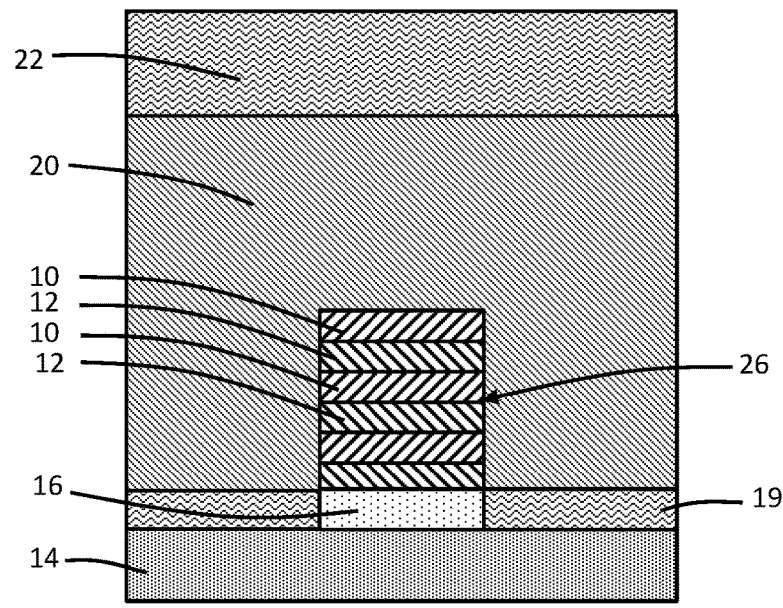

With reference to FIGS. 3, 3A in which like reference numerals refer to like features in FIGS. 2, 2A and at a subsequent fabrication stage of the processing method, composite sidewall spacers 21 are formed that wrap around the body feature 26, and that are positioned adjacent to the opposite sidewalls of each sacrificial gate structure 20 and its hardmask cap 22. Each composite sidewall spacer 21 includes a sidewall spacer 23 and a sidewall spacer 24 having an L-shape. The sidewall spacers 23 and 24 may be composed of respective dielectric materials that etch selectively to each other. For example, the sidewall spacers 23 may be composed of silicon nitride ($Si_3N_4$) and the sidewall spacers 24 may be composed of SiBCN. The dielectric material from the spacer deposition also fills the cavity 17 (FIGS. 2, 2A) to form a dielectric layer 16 that electrically isolates the body feature 26 from the substrate 14.

Figure 4:
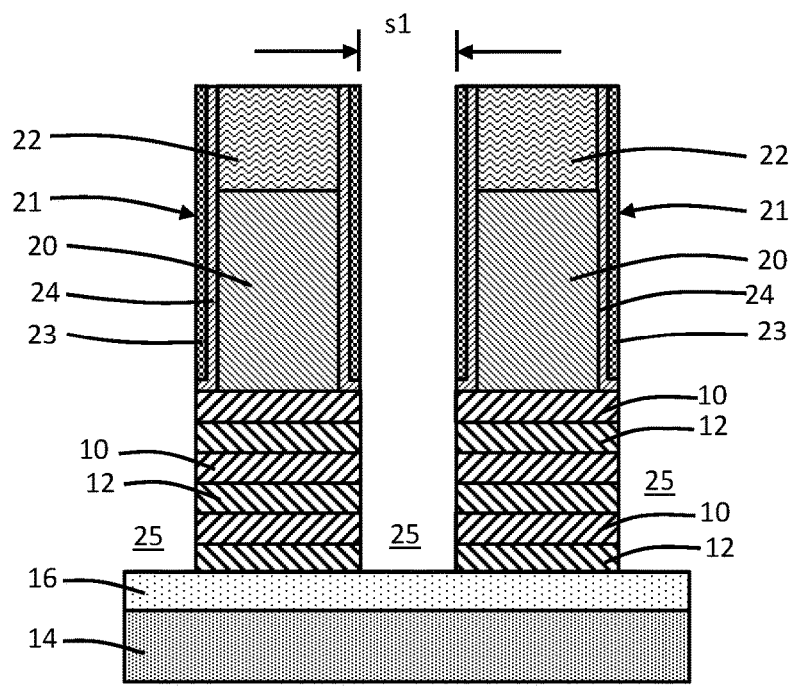
FIGS. 4-10 are cross-sectional views of the device structure at successive fabrication stages subsequent to FIG. 3.

With reference to FIG. 4 in which like reference numerals refer to like features in FIG. 3 and at a subsequent fabrication stage of the processing method, trenches 25 are formed that extend in a vertical direction through the body feature 26. The trenches 25 may be formed by an etching process that relies on the sacrificial gate structure 20 and associated composite sidewall spacers 21 as an etch mask. The self-aligned etching process, which may be a reactive ion etching (RIE) process, utilizes one or more etch chemistries to etch the trenches 25 with sidewalls that extend through the nanosheet channel layers 10 and sacrificial layers 12 of the body feature 26 to the dielectric layer 16. Because of the self-alignment of the etching process, the trenches 25 may be considered to extend vertically to the top surface of the hardmask caps 22 on the sacrificial gate structures 20 with the composite sidewall spacers 21 arranged at an upper section or portion of the trenches 25.

Figure 5:
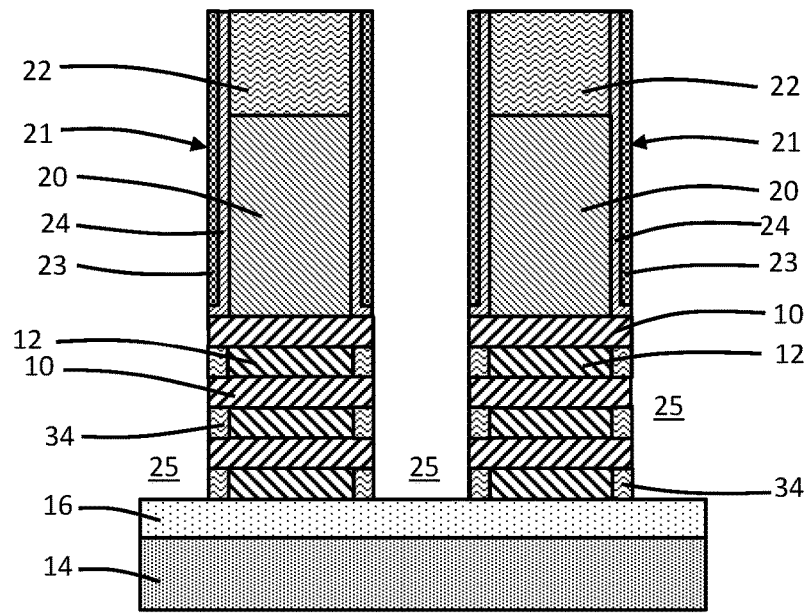

With reference to FIG. 5 in which like reference numerals refer to like features in FIG. 4 and at a subsequent fabrication stage of the processing method, the sacrificial layers 12 are laterally recessed relative to the nanosheet channel layers 10 with a dry or wet isotropic etching process that etches the material constituting the sacrificial layers 12 selective to the material constituting the nanosheet channel layers 10. The lateral recessing of the sacrificial layers 12 generates indents in the sidewalls of the lower section or portion of the trenches 25 because the nanosheet channel layers 10 are not laterally recessed due to the etch selectivity of the isotropic etching process.

Inner spacers 34 are subsequently formed in the indents adjacent to the recessed ends of the sacrificial layers 12. The inner spacers 34 may be formed by depositing a conformal layer composed of a dielectric material, such as silicon nitride ($Si_3N_4$), by atomic layer deposition (ALD), that fills the indents, and then performing an etching process that removes the deposited conformal layer outside of the indents.

Figure 6:
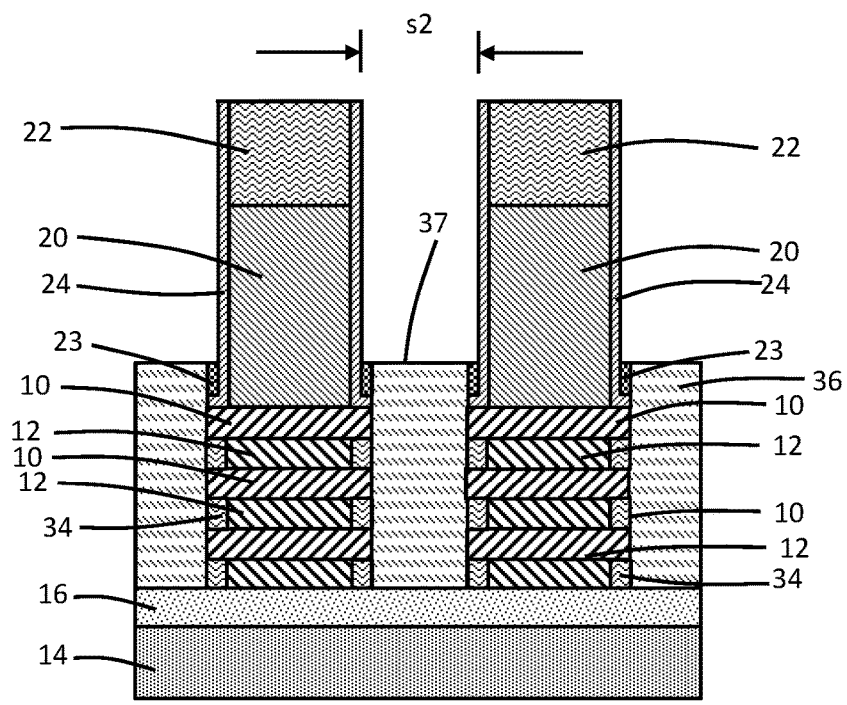

With reference to FIG. 6 in which like reference numerals refer to like features in FIG. 5 and at a subsequent fabrication stage of the processing method, a sacrificial layer 36 is formed with a targeted thickness within the trenches 25. The sacrificial layer 36 is arranged in part between the sidewall spacers 23, 24 at an upper portion of the trenches 25. The sacrificial layer 36 includes a top surface 37 located at a given height relative to the top surface of the dielectric layer 16 that is greater than the height of the body feature 26. The sacrificial layer 36 may be constituted by a spin-on hardmask (SOH), such as an organic planarization layer (OPL), that is applied by spin coating and recessed to the targeted thickness by an etch back process.

After the sacrificial layer 36 is recessed, sections or portions of the sidewall spacers 23 arranged above the top surface 37 of the sacrificial layer 36 in the upper portion of the trenches 25 are removed selective to the sidewall spacers 24. The partial removal of composite sidewall spacers 21 widens the separation between the composite sidewall spacers 21 and increases the perpendicular distance, $s2$, between the nearest portions of the composite sidewall spacers 21 (i.e., between the sidewall spacers 24). The thickness of the hardmask caps 22 may be reduced by the etching process that shortens the sidewall spacers 23.

Figure 7:
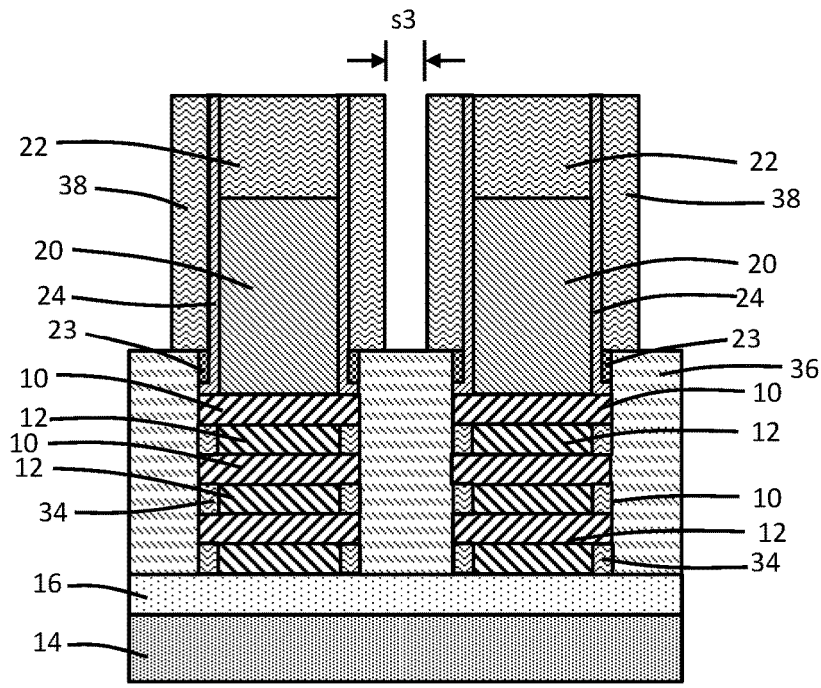

With reference to FIG. 7 in which like reference numerals refer to like features in FIG. 6 and at a subsequent fabrication stage of the processing method, sacrificial spacers 38 are formed above the recessed top surface 37 of the sacrificial layer 36 and the top surface 37 of the sacrificial layer 36. The sacrificial spacers 38 are arrange on the upper portion of the trenches 25. The sacrificial spacers 38 may be composed of a dielectric material, such as a nitride of silicon (e.g., $Si_3N_4$) or titanium oxide ($TiO_x$). The sacrificial spacers 38 may be formed by depositing a conformal layer of the dielectric material by atomic layer deposition (ALD) and etching the conformal layer with a directional etching process such as reactive ion etching (RIE). The distance, $s3$, between the sacrificial spacers 38 on adjacent sacrificial gate structures 20 is less than either the distance $s1$ or the distance $s2$. The increased distance (i.e., width) between the composite sidewall spacers 21, which results from their partial removal, increases the room or space available for the formation of the sacrificial spacers 38.

Figure 8:
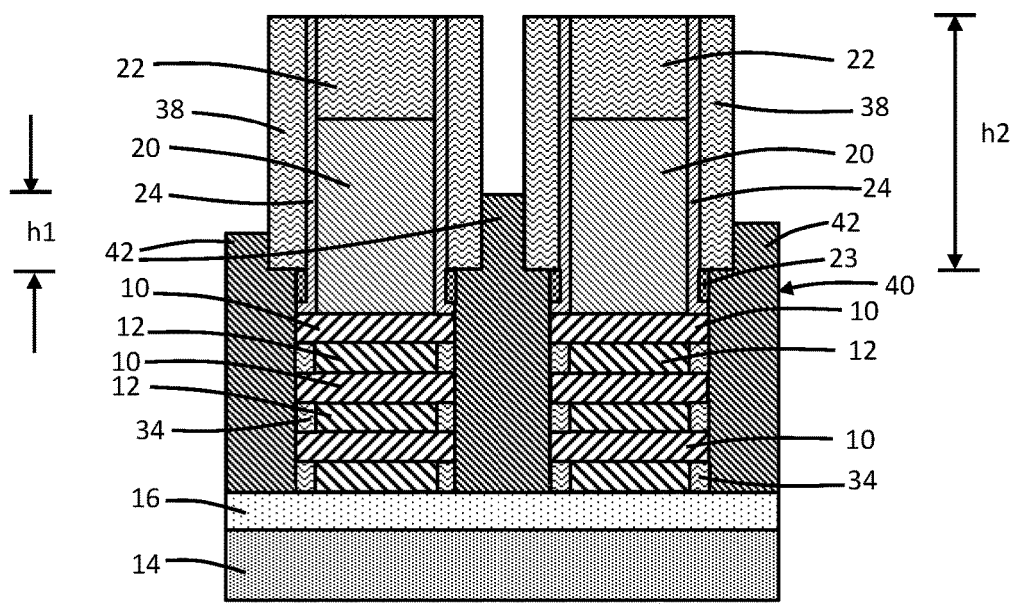

With reference to FIG. 8 in which like reference numerals refer to like features in FIG. 7 and at a subsequent fabrication stage of the processing method, the sacrificial layer 36 is stripped to reopen the lower portion of the trenches 25, and an epitaxial semiconductor layer 40 is formed inside the trenches 25. The epitaxial semiconductor layer 40 may be formed by an epitaxial growth process in which the semiconductor material grows from growth seeds provided by the exposed side surfaces of the nanosheet channel layers 10 and merges inside the trenches 25. The inner spacers 34 physically isolate the epitaxial semiconductor layer 40 from the sacrificial layers 12, and prevent unwanted epitaxial growth from the sacrificial layers 12.

The semiconductor material constituting the epitaxial semiconductor layer 40 may be heavily doped to have either p-type electrical conductivity or n-type electrical conductivity. In an embodiment, the epitaxial semiconductor layer 40 may be doped during epitaxial growth with an n-type dopant from Group V of the Periodic Table (e.g., phosphorus (P) and/or arsenic (As)) that provides n-type electrical conductivity. In an alternative embodiment, the epitaxial semiconductor layer 40 may be doped during epitaxial growth with a p-type dopant from Group III of the Periodic Table (e.g., boron (B), aluminum (Al), gallium (Ga), and/or indium (In)) that provides p-type electrical conductivity.

The epitaxial semiconductor layer 40 has a thickness that extends vertically above the body feature 26 and into the upper section of the trenches 25 between the sacrificial spacers 38 to define pillars 42. The pillars 42, which constitute upper portions of the semiconductor layer 40, are narrower than the lower portions of the epitaxial semiconductor layer 40 that are arranged below the sacrificial spacers 38. The width of the pillars 42 is equal to the spacing between the sacrificial spacers 38 due to the physical constraint provided by the sacrificial spacers 38 during epitaxial growth.

The height of the pillars 42 varies among the different trenches 25 over a range of different heights, h1, due to the existence of the pillars 42. The variation arises from variations in the epitaxial growth process. As a result, the thickness of the epitaxial semiconductor layer 40 varies among the different trenches 25. For example, variations in the side surfaces of the nanosheet channel layers 10 may cause variations in the epitaxial growth within different trenches 25 and the resulting height variations. Despite the height variation, the height of the pillars 42 is greater than the width of the pillars 42 such that the height-to-width ratio of the pillars 42 is greater than 1. This ratio is controlled as a dimensional relationship through the selection of the thickness of the sacrificial spacers 38 and the process growing the epitaxial semiconductor layer 40. The sacrificial spacers 38 are characterized by a height, h2, and the height of the pillars 42 is less than the height of the sacrificial spacers 38.

Figure 9:
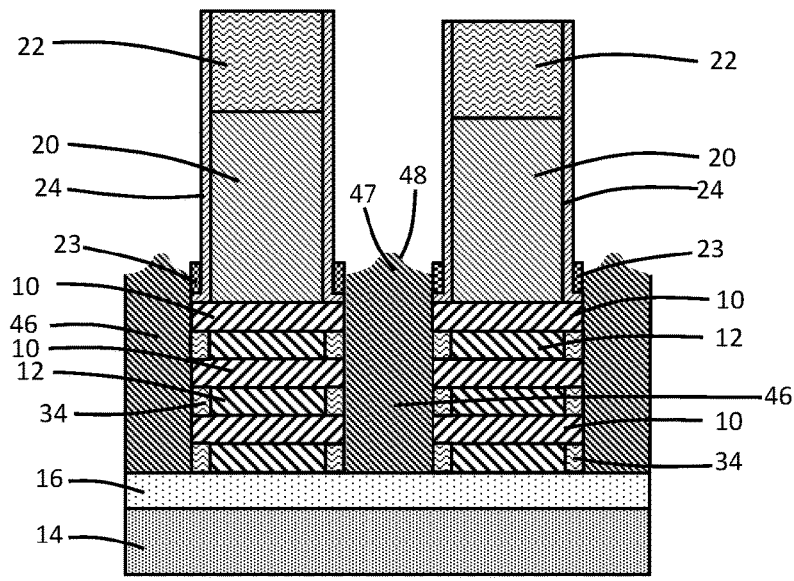

With reference to FIG. 9 in which like reference numerals refer to like features in FIG. 8 and at a subsequent fabrication stage of the processing method, the sacrificial spacers 38 are removed selective to the semiconductor material of the epitaxial semiconductor layer 40, which exposes the sidewalls of the pillars 42 (FIG. 6). To that end, a timed isotropic etching process is used to remove the majority of the pillars 42. The isotropic etching process may be horizontal and vertical etch rates are approximately equal (i.e., the etching is uniform in all directions with equal vertical and lateral etching components). The top surface of the pillars 42 will be etched in a vertical direction by the vertical etching component, and the sidewalls of the pillars 42 will be etched in a horizontal direction by the horizontal etching component. In an embodiment, the isotropic etching process may be a vapor-phased dry HCl etch. In an embodiment, the isotropic etching process may be a dry etch that relies on a mixture of ammonia ($NH_3$) and fluorine ($F_2$) source gases.

The remaining material of the epitaxial semiconductor layer 40 (FIG. 6), following the isotropic etching process, defines source/drain regions 46 of a nanosheet field-effect transistor. As used herein, the term "source/drain region" means a doped region of semiconductor material that can function as either a source or a drain of a nanosheet field-effect transistor. The source/drain regions 46 are physically isolated from the sacrificial layers 12 by the inner spacers 34. The lateral component of the isotropic etching process will narrow the width of the pillars 42 independent of their initial height, and will contribute to the production of source/drain regions 46 with a nominally uniform height.

The isotropic etching of the pillars 42 introduces topology into the top surfaces 47 of the source/drain regions 46, and eliminates the height variation of the pillars 42 such that the source/drain regions 46 have nominally equal heights or thicknesses. The top surfaces 47 may be non-planar, and may include a curved central section 48 that projects upwardly in the vertical direction. The non-planar and irregular top surfaces 47 may provide a larger surface area for establishing vertical contact from above with the source/drain regions 46 than in the instance of conventional planar top surfaces. The pillars 42 may be dimensioned and the time and ratio of the vertical and lateral components of the etching process may be controlled such that the topology is formed.

Figure 10:
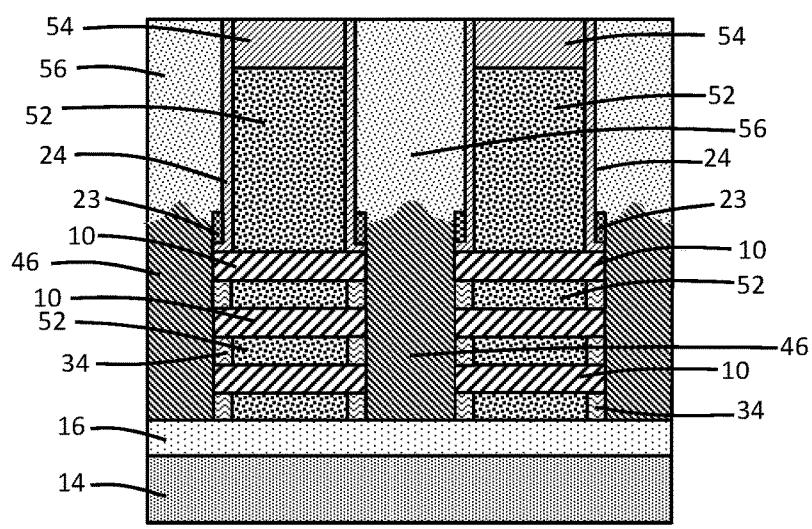

With reference to FIG. 10 in which like reference numerals refer to like features in FIG. 9 and at a subsequent fabrication stage of the processing method, the process flow continues with gate replacement. A dielectric layer (not shown) is deposited and planarized by chemical-mechanical polishing (CMP). In an embodiment, the dielectric layer may be composed of an electrical insulator, such as silicon dioxide ($SiO_2$). The dielectric layer and the hardmask caps 22 are polished to expose the sacrificial gate structures 20. The sacrificial gate structures 20 and sacrificial layers 12 may be sequentially removed with one or more etching processes selective to the nanosheet channel layers 10 and the inner spacers 34, which releases the nanosheet channel layers 10 and opens a space surrounding each nanosheet channel layer 10.

After removing the sacrificial gate structures 20 to release the nanosheet channel layers 10, functional gate structures 52 are formed in the spaces surrounding each of the nanosheet channel layers 10 as part of a replacement gate process to form a multiple-gate nanosheet field-effect transistor. Each functional gate structure 52 may include a gate dielectric layer composed of a dielectric material, such as a high-k dielectric like hafnium oxide ($HfO_2$), and a metal gate electrode. The gate dielectric layer is arranged between the metal gate electrode and the exterior surfaces of the nanosheet channel layers 10. The metal gate electrode includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). Self-aligned contact (SAC) caps 54 composed of a dielectric material, such as silicon nitride, are formed in the spaces over each of the functional gate structures 52.

Sections of the functional gate structure 52 are located in the spaces formerly occupied by the removed sacrificial layers 12. These sections of the functional gate structure surround respective exterior surfaces of the nanosheet channel layers 10 in a gate-all-around arrangement in which the sections of the functional gate structure 52 are wrapped about the individual nanosheet channel layers 10. The inner spacers 34 are arranged between the sections of the functional gate structures 52 and the source/drain regions 46.

Trench silicide (TS) contacts 56 are formed that extend vertically to the source/drain regions 46. The TS contacts 56 may include a metal silicide, such as tungsten silicide ($WSi_2$), titanium silicide ($TiSi_2$), nickel silicide (NiSi), or cobalt silicide ($CoSi_2$), as well as an overlying conductor, such as tungsten (W) or cobalt (Co). The TS contacts 56 may be planarized by chemical mechanical polishing (CMP) to the level of the caps 54. The TS contacts 56 join the source/drain regions 46 along the non-planar and irregular top surfaces, which may reduce the contact resistance due to the larger surface area in comparison with a conventional planar top surface.

While illustrated by the formation of a nanosheet field-effect transistor, the principles of the invention are applicable to the formation of other types of transistors, such as fin-type field-effect transistors, nanowire field-effect transistors, planar field-effect transistors, etc. While illustrated by the formation of a short-channel field-effect transistor, the principles of the invention are also applicable to the formation of a long-channel field-effect transistor. When forming a long-channel field-effect transistor, the pillars 42 are elongated and wider when the epitaxial semiconductor layer 40 is grown and, following the isotropic etch of the epitaxial semiconductor layer 40, the central section 48 of the top surfaces 47 may be flattened and also lengthened.

Figure 11:
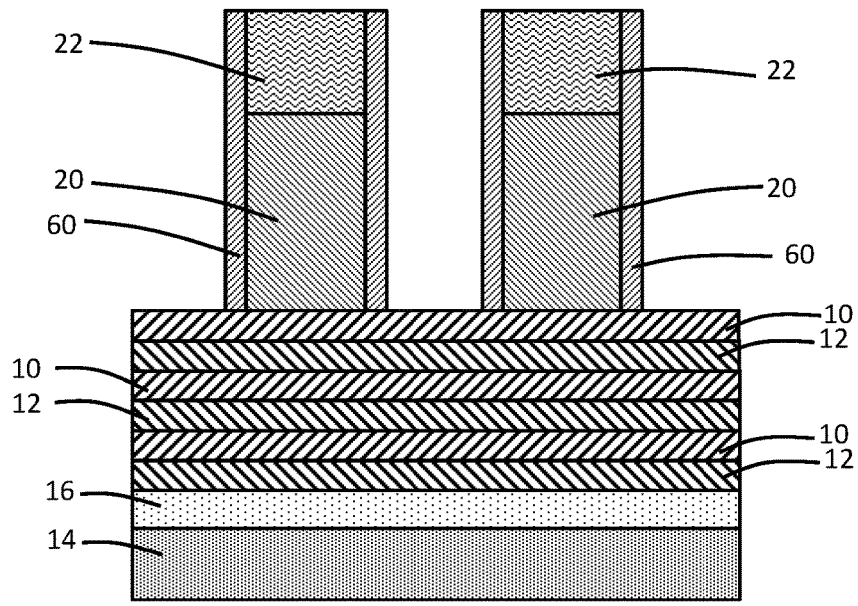
FIGS. 11-12 are cross-sectional views of a device structure at successive fabrication stages of a processing method in accordance with alternative embodiments of the invention.

With reference to FIG. 11 in which like reference numerals refer to like features in FIG. 1 and in accordance with alternative embodiments, sidewall spacers 60 are formed adjacent to the vertical sidewalls of each sacrificial gate structure 20 and its hardmask cap 22. The sidewall spacers 60 may be composed of a low-k dielectric material, such as SiBCN or SiOCN. The sidewall spacers 60 replace the composite sidewall spacers 21 that include the sidewall spacers 23 and sidewall spacers 24.

Figure 12:
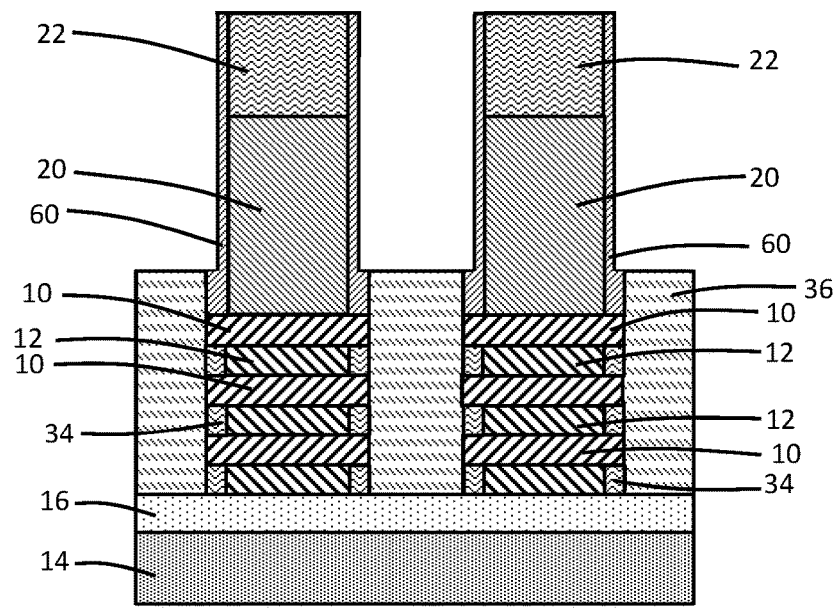

With reference to FIG. 12 in which like reference numerals refer to like features in FIG. 11 and at a subsequent fabrication stage of the processing method, the process flow continues as described in connection with FIGS. 4 and 5. After the sacrificial layer 36 is recessed and before forming the sacrificial spacers 38, the sidewall spacers 60 are partially removed above the top surface of the sacrificial layer 36 using a timed etching process. After the sacrificial spacers 38 are formed adjacent to the partially-removed sidewall spacers 30, the process continues as described in connection with FIGS. 7-10 to form the nanosheet field-effect transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a trench in one or more semiconductor layers;
    forming a first sacrificial sidewall spacer and a second sacrificial sidewall spacer on an upper portion of the trench;
    forming a material in the trench that is arranged in part between the first sacrificial sidewall spacer and the second sacrificial sidewall spacer;
    after forming the material in the trench, removing the first sacrificial sidewall spacer and the second sacrificial sidewall spacer; and
    after removing the first sacrificial sidewall spacer and the second sacrificial sidewall spacer, removing an upper portion of the material with an isotropic etching process.

2. The method of claim 1 wherein the material is a semiconductor material.

3. The method of claim 2 wherein forming the material in the trench that is arranged in part between the first sacrificial sidewall spacer and the second sacrificial sidewall spacer comprises:
    epitaxially growing the semiconductor material from the one or more semiconductor layers.

4. The method of claim 3 wherein the semiconductor material in the trench forms a source/drain region of a field-effect transistor.

5. The method of claim 4 wherein the one or more semiconductor layers include one or more nanosheet channel layers and one or more sacrificial layers that collectively constitute a body feature of the field-effect transistor, and the one or more nanosheet channel layers provide a seed for the epitaxial growth of the semiconductor material.

6. The method of claim 5 wherein the upper portion of the semiconductor material is reshaped by the isotropic etching process such that the source/drain region has a non-planar top surface.

7. The method of claim 6 further comprising:
forming a contact extending vertically to the non-planar top surface of the source/drain region.

8. The method of claim 1 wherein the one or more semiconductor layers include one or more nanosheet channel layers and one or more sacrificial layers that collectively constitute a body feature of a nanosheet field-effect transistor.

9. The method of claim 1 further comprising:
forming a first sidewall spacer and a second sidewall spacer above the one or more semiconductor layers,
wherein the trench is formed in the one or more semiconductor layers between the first sidewall spacer and the second sidewall spacer, and the first sacrificial sidewall spacer and the second sacrificial sidewall spacer are arranged between the first sidewall spacer and the second sidewall spacer.

10. The method of claim 9 wherein the isotropic etching process removes the upper portion of the material selective to the first sidewall spacer and the second sidewall spacer.

11. The method of claim 9 wherein the second sidewall spacer is spaced by a first spacing from the first sidewall spacer, and further comprising:
before forming the first sacrificial sidewall spacer adjacent to the first sidewall spacer and the second sacrificial sidewall spacer adjacent to the second sidewall spacer, partially removing the first sidewall spacer and the second sidewall spacer to provide a second spacing between a first portion of the first sidewall spacer and a first portion of the second sidewall spacer that is greater than the first spacing.

12. The method of claim 11 wherein the first sacrificial sidewall spacer is arranged adjacent to the first portion of the first sidewall spacer and the second sacrificial sidewall spacer is arranged adjacent to the first portion of the second sidewall spacer.

13. The method of claim 11 wherein the first sidewall spacer is arranged between the upper portion of the material and a first sacrificial gate structure, and the second sidewall spacer is arranged between the upper portion of the material and a second sacrificial gate structure, and further comprising:
replacing the first sacrificial gate structure with a first functional gate structure and the second sacrificial gate structure with a second functional gate structure.

14. The method of claim 11 wherein a lower portion of the trench has a width that is equal to the first spacing, the first sacrificial sidewall spacer is spaced from the second sacrificial sidewall spacer by a third spacing that is less than the first spacing, the upper portion of the material has a width that is equal to the third spacing and a height in a direction transverse to the width, and a ratio of the height to the width is greater than unity.

15. The method of claim 11 wherein partially removing the first sidewall spacer and the second sidewall spacer comprises:
forming a sacrificial layer arranged between the first sidewall spacer and the second sidewall spacer; and
recessing the sacrificial layer to partially expose the first sidewall spacer and the second sidewall spacer.

16. The method of claim 15 further comprising:
after recessing the sacrificial layer, partially removing a second portion of the first sidewall spacer and a second portion of the second sidewall spacer.

17. The method of claim 16 wherein the second portion of the first sidewall spacer and the second portion of the second sidewall spacer are removed with a timed etching process, and the first portion of the first sidewall spacer and the first portion of the second sidewall spacer remain after the timed etching process.

18. The method of claim 16 wherein the second portion of the first sidewall spacer and the second portion of the second sidewall spacer are removed with a selective etching process, and the first portion of the first sidewall spacer and the first portion of the second sidewall spacer remain after the selective etching process.

19. The method of claim 15 wherein the first sacrificial sidewall spacer and the second sacrificial sidewall spacer are formed after recessing the sacrificial layer, the first sacrificial sidewall spacer and the second sacrificial sidewall spacer are arranged in part over the sacrificial layer, and further comprising:
before forming the material in the trench, removing the sacrificial layer from beneath the first sacrificial sidewall spacer and the second sacrificial sidewall spacer.

* * * * *